United States Patent [19]

Miura

[11] 4,066,837

[45] Jan. 3, 1978

[54] HIGH FREQUENCY ELECTRICAL SHIELD ASSEMBLY

[75] Inventor: Katsuhiko Miura, Soma, Japan

[73] Assignee: Alps Electric Co., Ltd., Tokyo, Japan

[21] Appl. No.: 688,615

[22] Filed: May 21, 1976

[30] Foreign Application Priority Data

May 22, 1975 Japan ................................ 50-68994

[51] Int. Cl.² ............................................. H05K 9/00
[52] U.S. Cl. .......................... 174/35 GC; 174/35 MS
[58] Field of Search .......... 174/35 R, 35 GC, 35 MS; 361/424; 325/357; 330/68; 336/84 C

[56] References Cited

U.S. PATENT DOCUMENTS 2,317,817  4/1943  Schoenborn .................... 174/35 GC

*Primary Examiner*—J. V. Truhe
*Assistant Examiner*—D. A. Tone
*Attorney, Agent, or Firm*—Guy W. Shoup

[57] ABSTRACT

An electrically conductive box for enclosing a high frequency electronic circuit has one open side and is divided into a number of chambers by partitions. The edges of the open end of the box and the partitions are formed with tabs. A resilient conductive sheet covers the open side of the box and is formed with holes through which the tabs extend. An electrically conductive plate is also formed with holes through which the tabs extend and is placed on top of the sheet. The tabs are twisted to clamp the plate and sheet to the box. The inner surface of the plate is formed with protuberances to resiliently deform the sheet so that the sheet is stretched for firm mechanical and electrical contact with the edges of the box and partitions.

7 Claims, 5 Drawing Figures

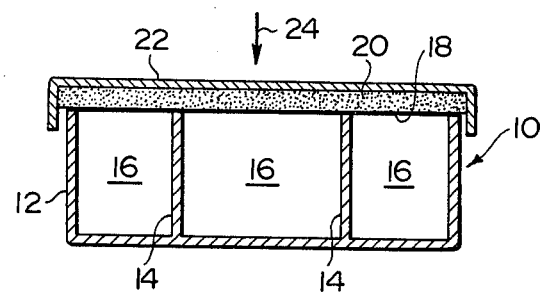
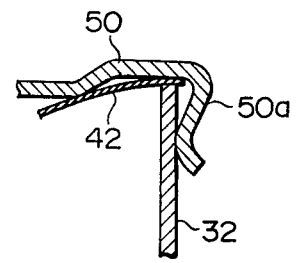
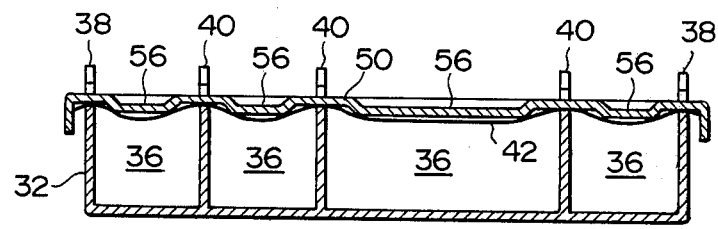
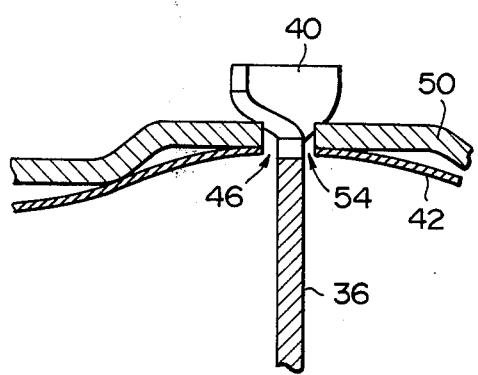

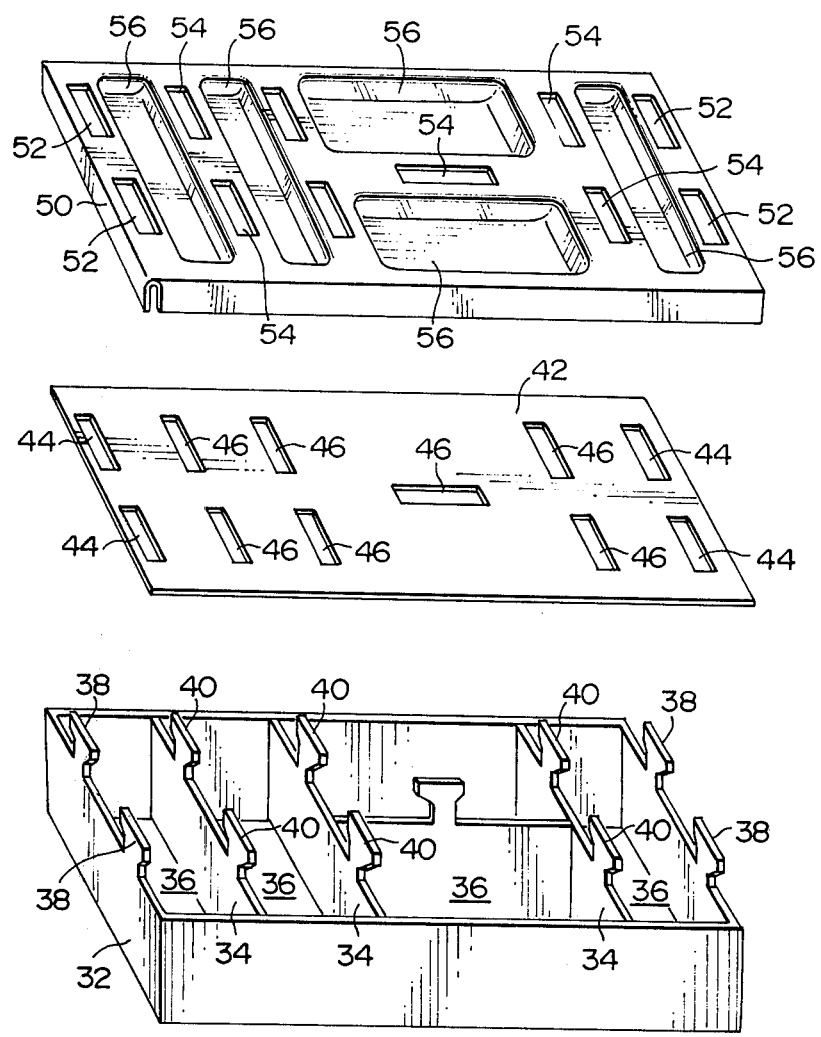

HIGH FREQUENCY ELECTRICAL SHIELD ASSEMBLY

BACKGROUND OF THE INVENTION

The present invention relates to a high frequency electrical shield assembly for housing an electrical circuit such as a television tuner, cable television converter or the like.

A known construction of a high frequency shield assembly comprises an electrically conductive box having one open side. An electrically conductive inner plate engages with the covers the open side. A resilient sheet is placed over the inner plate and an outer plate is spring biased into engagement with the resilient sheet to firmly hold the inner plate in contact with the box. The resilient sheet is formed of a material such as rubber or polyethylene having a high dielectric constant, and serves the purpose of maintaining the inner plate in firm engagement with the box when the shield assembly is exposed to vibration or impact.

This prior art shield assembly suffers from the drawback that it comprises two metal plates and is therefore relatively expensive to manufacture. It suffers from a further drawback in that the two plates act as a wageguide at the operating frequencies of the circuit housed in the shield. This causes dissipation of radio frequency energy from the circuit in the shield. In a case in which the circuit is a television tuner comprising a local oscillator, the propogation of radio frequency through the resilient material between the plates causes instability in the frequency of the local oscillator.

SUMMARY OF THE DISCLOSURE

In brief, the present shield assembly comprises an electrically conductive box having one open side. The interior of the box is divided into a number of chambers by partitions. The edges of the open end of the box and the partitions are formed with tabs. An electrically conductive resilient sheet engages with and covers the open side of the box and is formed with holes through which the tabs extend. An electrically conductive plate is also formed with holes through which the tabs extend, and is placed over the sheet. The tabs are twisted to clamp the plate and sheet to the box. The inner surface of the plate is formed with protuberances to resiliently deform the sheet so that the sheet is stretched for firm mechanical and electrical contact with the edges of the box and partitions.

It is an object of the present invention to provide a high frequency electrical shield assembly with comprises fewer parts than known high frequency shield assemblies.

It is another object of the present invention to provide a shield assembly which prevents dissipation of radio frequency energy from an electrical circuit housed in the shield assembly.

Other objects, together with the foregoing, are attained in the embodiment described in the following description and illustrated in the accompanying drawings.

BRIEF DESCRIPTION OF THE DRAWINGS

FIG. 1 is a sectional view of a prior art shield assembly;

FIG. 2 is an exploded perspective view of a shield assembly embodying the present invention;

FIG. 3 is a sectional view of the present shield assembly;

FIG. 4 is a fragmentary sectional view, in enlarged scale, of a portion of the present shield assembly; and FIG. 5 is a fragmentary sectional view, in enlarged scale, of a modification of the present shield assembly shown in FIG. 2.

DESCRIPTION OF THE PREFERRED EMBODIMENT

While the shield assembly of the invention is susceptible of numerous physical embodiments, depending on the environment and requirements of use, substantial numbers of the herein shown and described embodiment have been made, tested and used, and all have performed in an eminently satisfactory manner.

Referring to FIG. 1, a prior art shield assembly 10 comprises an electrically conductive box 12 having an open side which is divided into chambers 16 by partitions 14. An electrically conductive inner plate 18 contacts the edges of the box 12 and partitions 14 to cover the open side. A resilient sheet 20 is placed on top of the plate 18 and an inner plate 22 formed of an electrically conductive material is placed on top of the sheet 20. Biasing means such as sprints (not shown) apply a force to the plate 22 in the direction of an arrow 24 to resiliently compress the sheet 20 and firmly hold the plate 18 in contact with the box 12. It will be noted that the plates 18 and 22 constitute a waveguide path at the operating frequencies of a circuit (not shown) housed in the box 12 to dissipate radio frequency energy and cause circuit instability.

Referring now to FIG. 2, a shield assembly 30 embodying the present invention comprises an electrically conductive box 32 having an open upper side, the interior of the box 32 being divided into chambers 36 by partitions 34. The edges of the open sides of the box 32 are formed with tabs 38, the end portions of the tabs 38 being wider than the base portions thereof. The edges of the partitions 34 are also formed with tabs 40 which are identical to the tabs 38.

An electrically conductive resilient sheet formed of, for example, metal is designated as 42 and is placed over the open side of the box 32 to cover the same. The sheet 42 is formed with holes 44 through which the tabs 38 extend and holes 46 through which the tabs 40 extend.

An electrically conductive cover plate 50 is placed on top of the sheet 42 and is formed with holes 52 through which the tabs 38 extend and holes 54 through which the tabs 40 extend. The plate 50 is further formed with protuberances 56 facing into the chamber 36. The protuberances 56 are preferably formed by a pressing operation and serve, in addition to a primary function which will be described below, to mechanically strengthen the plate 50. The tabs 38 and 40 are twisted so as to engage with the outer surface of the plate 50 and firmly clamp the plate 50 and sheet 42 to the box 32. This is shown in enlarged scale in FIG. 4.

Referring now to FIG. 3, it will be seen that the protuberances 56 serves to resiliently deform the sheet 42 so as to protrude into the chambers 36. This serves to locally vary the spacing between the sheet 42 and the bottom of the box 32 which has the effect of inhibiting radio frequency waves from propogating therebetween. In addition, the sheet 42 is resiliently stretched so as to firmly contact the edges of the box 32 and partitions 34, even if the shield assembly 30 is exposed to vibration or impact.

Whereas the edges of the plate 50 may be unbent, or as illustrated in FIG. 2 bent perpendicular to the surface of the plate 50, the edges of the plate 50 may be bent as shown at 50a in FIG. 5 to contact the sides of the box 32. This serves to provide a stronger mechanical connection between the plate 50 and the box 32 and also serves to electrically connect the plate 50 directly to the box 32.

Other modifications are possible within the scope of the present invention. For example, the tabs 38 and 40 may be replaced by tabs which are adapted to be bent over, rather than twisted to engage with the outer surface of the plate 50, although not shown. As another alternative, tabs may be provided which are not adapted to be twisted, and a spring arrangement, not shown, employed to urge the plate 50 toward the box 32. The latter arrangement, although being slightly moe expensive to manufacture, would allow the shield assembly to be readily disassembled for servicing of the enclosed circuit or the like.

What is claimed is:

1. An electrical shield assembly comprising:
an electrically conductive box having an open side;
an electrically conductive resilient sheet engaging with and covering the open side of the box;
an electrically conductive plate formed with protuberances facing into the box; and
biasing means urging the plate into firm contact with the sheet in such a manner that the sheet is resiliently deformed by the protuberances 2. The shield assembly according to claim 1, in which the box is provided with a partition, the protuberances facing into chambers defined in the box by the partition.

3. The shield assembly according to claim 2, in which an edge of the partition is formed with a tab, the sheet and plate being formed with holes through which the tab of the portion extends.

4. The shield assembly according to claim 3, in which the biasing means comprises the tabs, end portions of the tabs being wider than base portions thereof, the tabs being twisted so as to engage with an outer surface of the plate and urge the plate toward the box.

5. The shield assembly according to claim 1, in which edges of the open end of the box are respectively formed with tabs, the sheet and plate being formed with holes through which the tabs extend.

6. The shield assembly according to claim 5, in which the biasing means comprises the tabs, end portions of the tabs being wider than base portions thereof, the tabs being twisted so as to engage with an outer surface of the plate and urge the plate toward the box twisted so as to engage with an outer surface of the plate and urge the plate toward the box.

7. The shield assembly according to claim 1, in which an edge of the plate is bent so as to engage with the box.

* * * * *